(12) United States Patent
Wang

(10) Patent No.: US 11,271,001 B2
(45) Date of Patent: Mar. 8, 2022

(54) SEMICONDUCTOR DEVICE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Nan Wang, Shanghai (CN)

(73) Assignees: Semiconductor Manufacturing International (Beijing) Corporation, Beijing (CN); Semiconductor Manufacturing International (Shanghai) Corporation, Shanghai (CN)

(*) Notice: Subject to any disclaimer, the term of this patent is extended or adjusted under 35 U.S.C. 154(b) by 384 days.

(21) Appl. No.: 16/535,436

(22) Filed: Aug. 8, 2019

(65) Prior Publication Data

US 2020/0058655 A1 Feb. 20, 2020

(30) Foreign Application Priority Data

Aug. 14, 2018 (CN) .......................... 201810923903.5

(51) Int. Cl.
*H01L 27/11* (2006.01)
*H01L 27/02* (2006.01)
(Continued)

(52) U.S. Cl.
CPC ..... *H01L 27/1104* (2013.01); *H01L 21/31111* (2013.01); *H01L 21/31144* (2013.01);
(Continued)

(58) Field of Classification Search
CPC ............. H01L 27/1104; H01L 27/0207; H01L 27/0924; H01L 29/0653; H01L 29/0847;
(Continued)

(56) References Cited

U.S. PATENT DOCUMENTS 9,431,399 B1* 8/2016 Alptekin ........... H01L 29/41791
9,911,736 B1* 3/2018 Zang ................. H01L 29/78651
2019/0164838 A1* 5/2019 Chang ................. H01L 29/0649

FOREIGN PATENT DOCUMENTS

CN 108281425 A 7/2018
JP 2011258822 A 12/2011

* cited by examiner

*Primary Examiner* — Karen Kusumakar
*Assistant Examiner* — Adam S Bowen
(74) *Attorney, Agent, or Firm* — Anova Law Group, PLLC

(57) ABSTRACT

Semiconductor devices and fabrication methods are provided. An exemplary fabrication method includes providing a base substrate having a first region, a second region and a third region; forming a dielectric layer on the base substrate; forming a first mask layer on the dielectric layer in the second region; forming a second mask layer on sidewall surfaces of the first mask layer and on the dielectric layer in the second region; etching the dielectric layer in the first region and the third region using the first mask layer and the second mask layer as an etching mask to form a first trench in the first region and a first trench in the third region; removing the first mask; and etching the dielectric layer in the second region using the second mask layer as an etching mask to form a second trench in the dielectric layer in the second region.

20 Claims, 5 Drawing Sheets

(51) Int. Cl.
*H01L 27/092* (2006.01)
*H01L 29/06* (2006.01)
*H01L 29/08* (2006.01)
*H01L 21/8238* (2006.01)
*H01L 21/311* (2006.01)
*H01L 29/45* (2006.01)

(52) U.S. Cl.
CPC ........... *H01L 21/823814* (2013.01); *H01L 21/823821* (2013.01); *H01L 21/823871* (2013.01); *H01L 21/823878* (2013.01); *H01L 27/0207* (2013.01); *H01L 27/0924* (2013.01); *H01L 29/0653* (2013.01); *H01L 29/0847* (2013.01); *H01L 29/45* (2013.01)

(58) Field of Classification Search
CPC ....... H01L 21/823871; H01L 21/31111; H01L 21/31144; H01L 21/823821; H01L 21/823878; H01L 21/823814; H01L 29/45; H01L 21/823431; H01L 27/0886; H01L 21/823418; H01L 21/823475
See application file for complete search history.

SEMICONDUCTOR DEVICE AND FABRICATION METHOD THEREOF

CROSS-REFERENCES TO RELATED APPLICATIONS

This application claims the priority of Chinese patent application No. 201810923903.5, filed on Aug. 14, 2018, the entirety of which is incorporated herein by reference.

FIELD OF THE DISCLOSURE

The present disclosure generally relates to the field of semiconductor manufacturing and, more particularly, relates to semiconductor devices and fabrication methods.

BACKGROUND

With the rapid development of the semiconductor manufacturing technologies, memory devices are moving toward high integration level, fast speed and low power consumption.

According to their functions, the memory devices are categorized into random access memory (RAM) and read only memory (ROM). When a RAM is in operation, data can be read from any specified address at any time, and the data can be written to any specified storage unit at any time. The RAM is easy to read and write, and flexible to use.

The RAM can be divided into static random access memory (SRAM) and dynamic random access memory (DRAM). Among these RAMs, the SRAM utilizes a trigger with a positive feedback to achieve the data storage, and mainly relies on a continuous power supply to maintain data integrity. The SRAM does not need to be refreshed during operation; and has been widely used in high speed caching and frequent data processing in computers.

However, there is a need to improve the performance of the SRAM. The disclosed methods and semiconductor devices are directed to solve one or more problems set forth above and other problems in the art.

BRIEF SUMMARY OF THE DISCLOSURE

One aspect of the present disclosure includes a method for forming a semiconductor device. The method may include providing a base substrate having a first region, a second region, a third region and a plurality of fins. The second region may be between the first region and the third region, and the second region may be adjacent to the first region and the third region. The method may also include forming a first doped layer in the first region of the base substrate; forming a second doped layer adjacent to the first doped layer in the third region of the base substrate; forming a dielectric layer on the base substrate and covering the first doped layer and the second doped layer; forming a first mask layer on the dielectric layer in the second region; forming a second mask layer on sidewall surfaces of the first mask layer and on the dielectric layer in the second region; etching the dielectric layer in the first region and the third region using the first mask layer and the second mask layer as an etching mask to form a first trench exposing the first doped layer in the first region and a first trench exposing the second doped layer in the third region; removing the first mask; and etching the dielectric layer in the second region using the second mask layer as an etching mask to form a second trench in the dielectric layer in the second region.

Another aspect of the present disclosure includes a semiconductor device. The semiconductor device may a base substrate having a first region, a second region and a third region and a plurality of fins; an isolation layer formed on the base substrate and covering portions of the sidewall surfaces of the fins; a first doped layer formed on the first region of the base substrate; a second doped layer formed on the third region of the base substrate; a dielectric layer formed on the insolation layer and covering the sidewall surfaces of the first doped layer and the second doped layer; a first conductive structure formed in the dielectric layer in the first region and a first conductive structure formed in the dielectric layer in the third region; and a second conductive structure formed in the dielectric layer in the second region. The distance between the second conductive structure and the first conductive structure in the first region and a distance between the second conductive structure and the first conductive structure in the third region are substantially equal.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
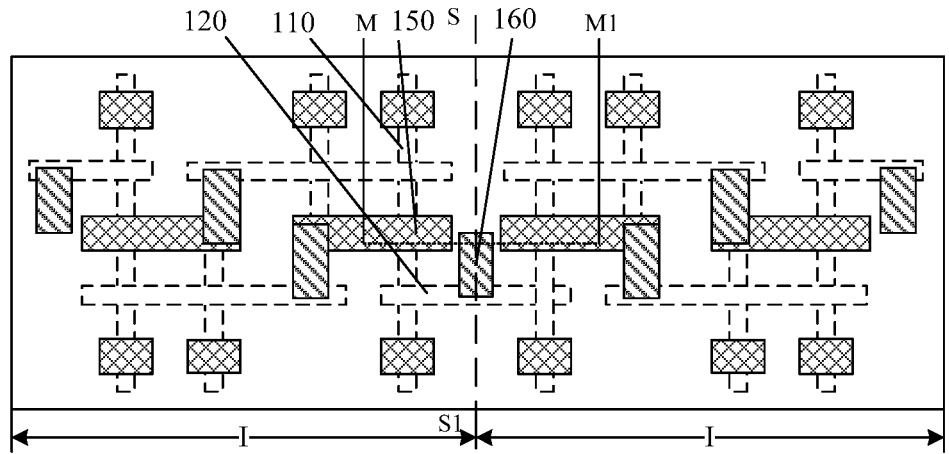
FIGS. 1-2 illustrate a static random access memory (SRAM) device.
Figure 2:
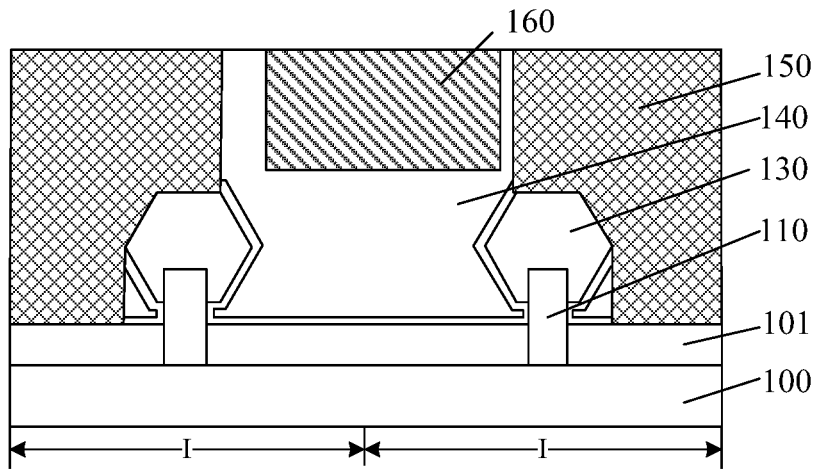

FIGS. 1-2 illustrate a static random access memory (SRAM) device. FIG. 1 is a top view of the SRAM device; and FIG. 2 is an M-M1 sectional view of the SRAM device in FIG. 1.

As shown in FIGS. 1-2, the SRAM device includes a substrate 100. The substrate 100 includes adjacent device regions I. The adjacent device regions I are mirror-connected along the axis S-S1. The surface of the device regions I of the substrate 100 have fins 110 and an isolation layer 101. The isolation layer 101 covers portions of the sidewall surfaces of the fins 110, and the fins 110 of the adjacent device regions I are adjacent to each other. Further, the SRAM device includes gate structures 120 across the fins 110 of the adjacent device regions I; and doped source/drain layers in the fins 110 at both sides of the gate structures 120 in the device regions I. The doped source/drain layers 130 of the adjacent device regions I are adjacent to each other. Further, the SRAM device includes a dielectric layer 140 on the surface of the substrate 100. The dielectric layer 140 covers the device regions I, the top surfaces of the source/drain layers 130 of the adjacent device regions I, and the top surfaces and the sidewall surfaces of the gate structures 120.

Further, the SRAM device includes first conductive structures 150 and second conductive structures 160 in the dielectric layer 140. The first conductive structures 150 are across the doped source/drain layers 130 and cover portions of the top and sidewall surfaces of the doped source/drain layers 130. The second conductive structures 160 cover portions of the top surfaces of the gate structures 120.

In the SRAM device, the first conductive structures 150 are used to connect a first metal interconnect layer and the doped source/drain layers 130, and the second conductive structures 160 are used to connect the first metal interconnect layer and the gate structures 120. After forming the first conductive structures 150, the second conductive structure 160 are formed. During the process for forming the second conductive structures 160, a photolithography process is required to form trenches. Because the precision of the photolithography process is limited, the positions of the trenches are easily deviated, and the distances between a trench and two adjacent first conductive structures 150 are not equal. If the dielectric layer between the second conductive structure 160 and the first conductive structure 150 is too thin, it is easy to have a current leakage issue. Especially when the trench is severely deviated, a bridging issue is also likely to occur between the first conductive structure 150 and the second conductive structure 160. Thus, the performance of the SRAM device is not as expected.

The present disclosure provides a semiconductor device and a method for forming a semiconductor device. In the method for forming a semiconductor device, a second mask layer may be formed on the sidewall surfaces of a first mask layer. The first mask layer and the second mask layer may together define the position of the first trenches; and the second mask layer may define the position of the second trench such that the thicknesses of the dielectric layer between the second trench and the adjacent first trenches may be substantially equal. The first conductive structures may be subsequently formed in the first trenches; and a second conductive structure may be subsequently formed in the second trench. The thicknesses of the dielectric layer between the second conductive structure and the adjacent first conductive structures may be the same, and the isolation effect may be as desired. Further, the width of the second mask layer may be easy to control, and the probability for having the current leakage issue between the second conductive structure and the adjacent first conductive structures may be reduced. Accordingly, the performance of the semiconductor device may be improved.

Figure 11:
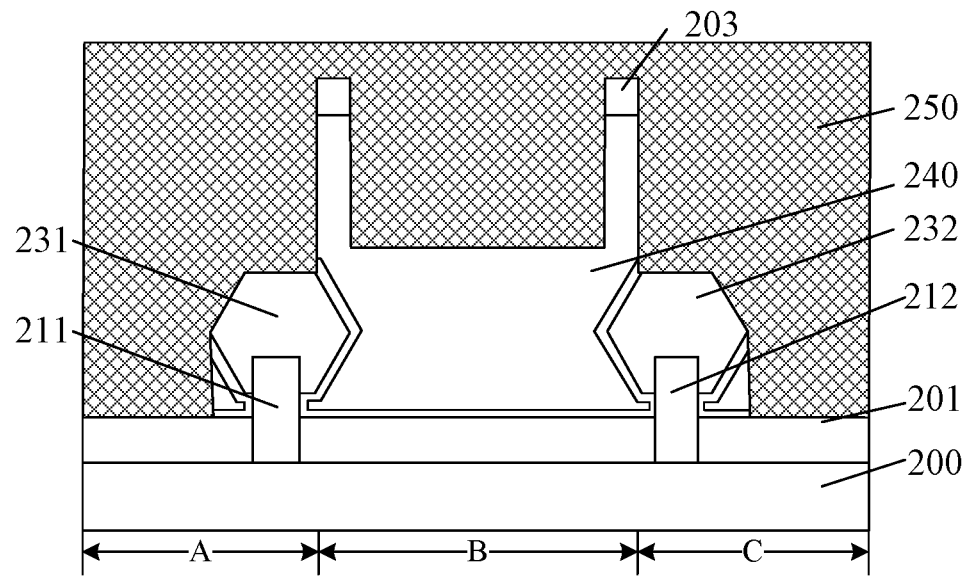
Figure 12:
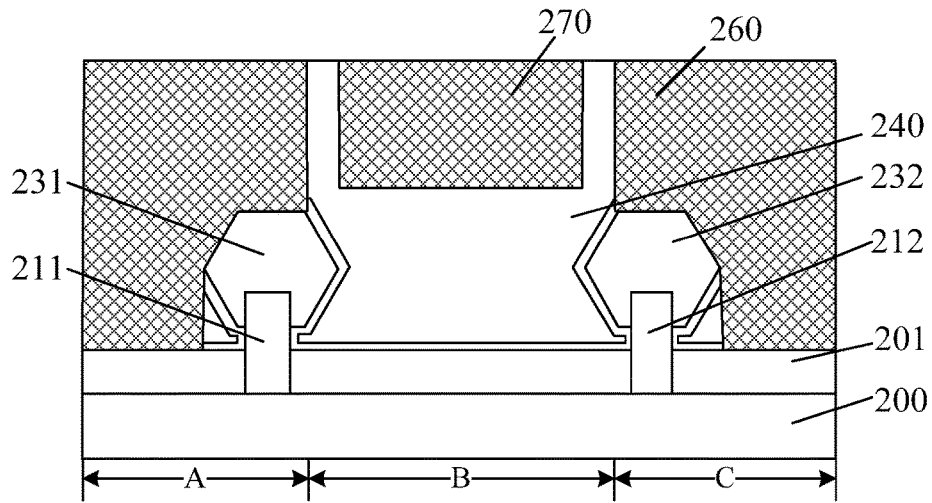
Figure 13:
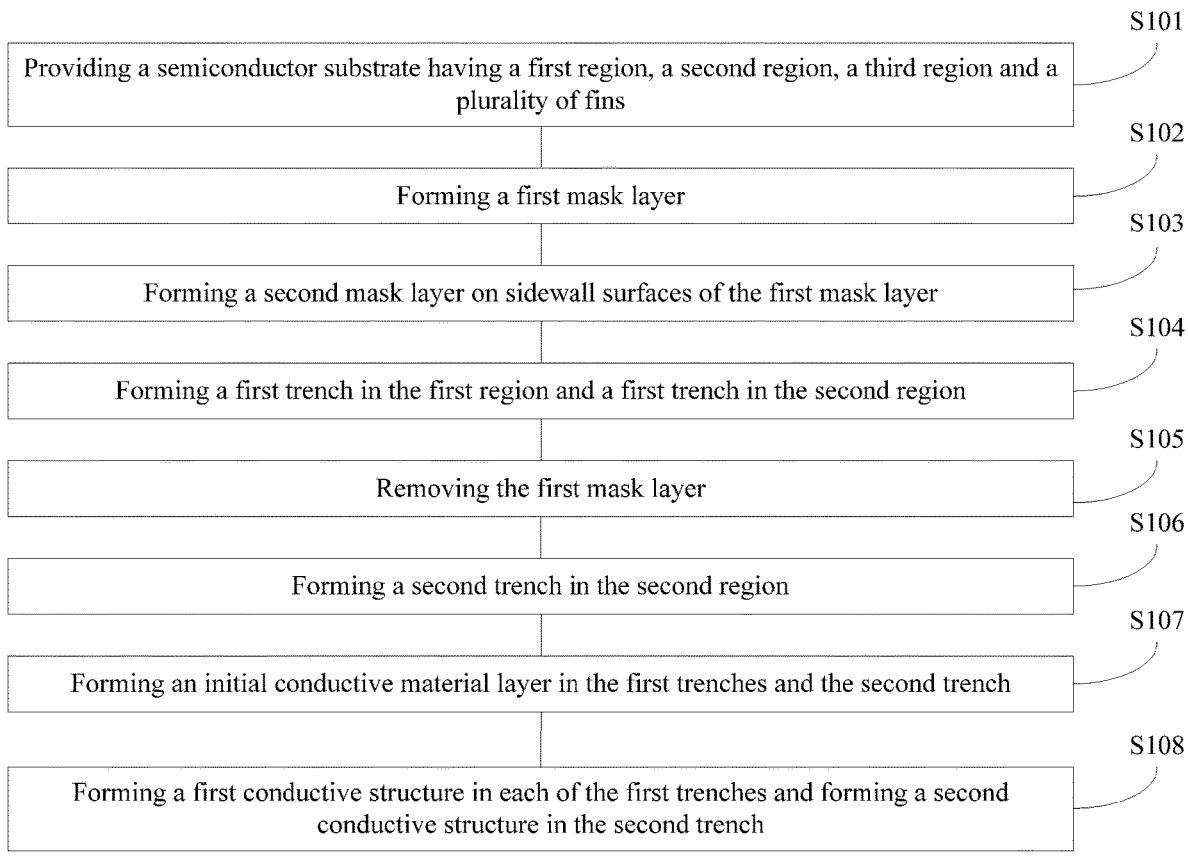
FIG. 13 illustrates an exemplary fabrication process of a semiconductor device consistent with various disclosed embodiments.

FIG. 13 illustrates an exemplary fabrication method of a semiconductor device consistent with various disclosed embodiments. FIGS. 3-12 illustrate structures corresponding to certain stage during the exemplary fabrication method.

Figure 3:
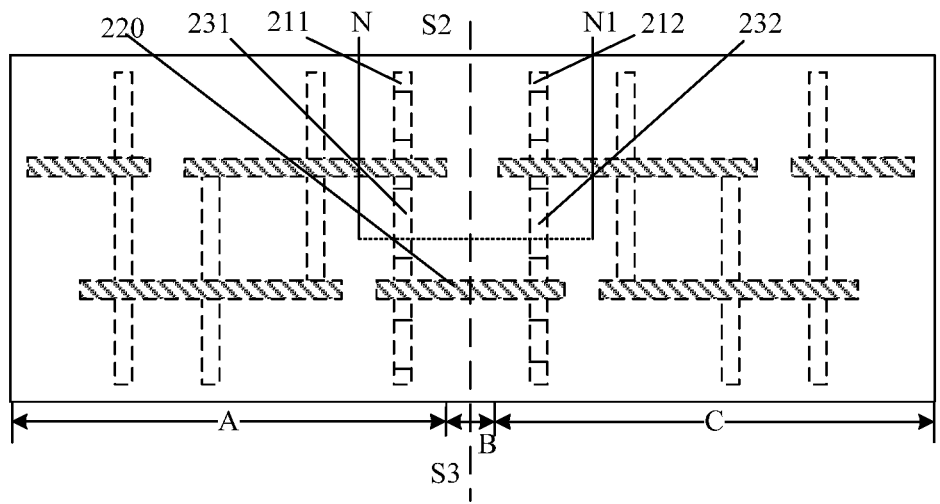
FIGS. 3-12 illustrate structures corresponding to certain stages during an exemplary fabrication process of a semiconductor device consistent with various disclosed embodiments.
Figure 4:
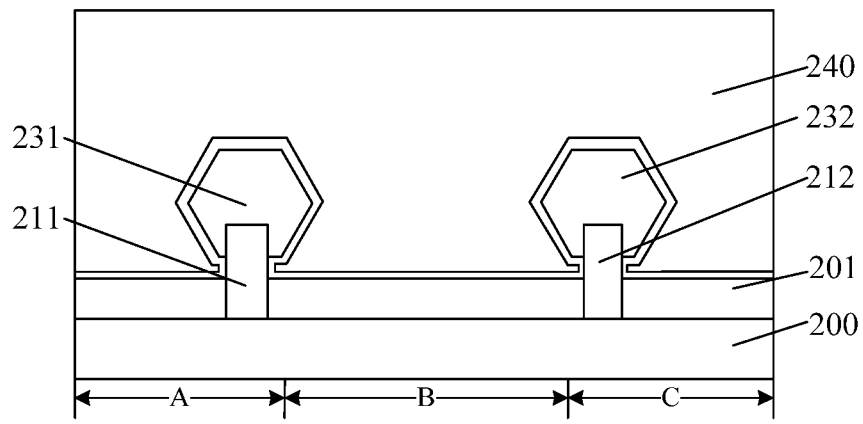

As shown in FIG. 13, at the beginning of the fabrication process, a base substrate with certain structures is provided (S101). FIGS. 3-4 illustrate a corresponding semiconductor structure. FIG. 3 is a top view of the semiconductor structure, and FIG. 4 is an N-N1-sectional view of the structure in FIG. 3.

As shown in FIGS. 3-4, a base substrate is provided. The base substrate may include a first region A, a second region B, and a third region C. The second region B may be between the first region A and the third region C, and the second region B may be adjacent to the first region A and the third region C.

In one embodiment, the base substrate may further include a first device region and a second device region (not labeled). The first device region may be adjacent to the second device region, and the first device region and the second device region may be axisymmetric along the central line S2-S3 of the second region B. The first region A may be located in the first device region, and the third region C may be located in the second device region.

Further, a first doped layer 231 may be formed in the first region A of the base substrate, and a second doped layer 232 may be formed in the third region C of the base substrate. The second doped layer 232 may be adjacent to the first doped layer 231.

For illustrative purpose, only the first device region and the second device region adjacent to the first device region of the semiconductor device are shown in FIG. 3.

In one embodiment, the first device region and the second device region may be used to form a static random access memory (SRAM). In another embodiment, the first device region and the second device region may be used to form PMOS transistors or NMOS transistors.

The base substrate may further include first fins 211, second fins 212 and first gate structures 220. The first fins 211 may be formed in the first region A of the base substrate, and the second fins 212 may be formed in the third region C of the base substrate. The first gate structures 220 may be formed on the first region A, the second region B and the third region C of the base substrate. Further, the first gate structures 220 may be across the first fins 211 and the second fins 212 by covering portions of sidewall surfaces and top surfaces of the first fins 211 and the second fins 212. The first doped layer 231 may be formed in the first fins 211 at both sides of the first gate structures 220, and the second doped layers 232 may be formed in the second fins 212 at both sides of the first gate structures 220.

In one embodiment, the first fins 211 and the second fins 212 may be used as fins of the transfer transistors and the pull-down transistors.

The base substrate may also include a semiconductor substrate 200. The first fins 211, the second fins 212, and the first gate structures 220 may be formed on the semiconductor substrate 200.

The semiconductor substrate 200 may be made of any appropriate semiconductor material, such as silicon, germanium, silicon germanium, gallium arsenide, indium gallium arsenide, etc. The silicon material may include single crystal silicon, polycrystalline silicon or amorphous silicon. The semiconductor substrate 200 may also be a semiconductor-on-insulator (SOI) structure including an insulator and a semiconductor material layer on the insulator. The semiconductor material layer may be made a semiconductor material, such as silicon, germanium, silicon germanium, gallium arsenide, or indium gallium arsenide, etc. In one embodiment, the semiconductor substrate 200 is made of single crystal silicon.

In one embodiment, the first fins 211 and the second fins 212 may be formed by patterning the semiconductor substrate 200.

In one embodiment, the first fins 211 and the second fins 212 may be made of single crystal silicon. In another embodiment, the first fins 211 and the second fins 212 may be made of single crystal germanium silicon, or other semiconductor material.

In one embodiment, as shown in FIG. 4, an isolation layer 201 may be formed on the semiconductor substrate 200. The isolation layer 201 may cover bottom portions of sidewall surfaces of the first fins 211 and the second fins 212. The isolation layer 201 may be made of any appropriate material, such as silicon oxide, etc.

In one embodiment, a first gate structure 220 may include a gate dielectric layer and a gate layer on the gate dielectric layer. The gate dielectric layer may be made of a high K (K greater than 3.9) dielectric material, and the gate layer may be made of a metal material, such as tungsten, etc.

Further, as shown in FIG. 4, a dielectric layer 240 may be formed on the base substrate. The dielectric layer 240 may cover the first doped layer 231 and the second doped layer 232.

In one embodiment, the dielectric layer 240 may include a first interlayer dielectric layer and a second interlayer dielectric layer. The first interlayer dielectric layer may cover the sidewall surfaces of the first gate structures 220, and the second interlayer dielectric layer may cover the top surfaces of the first gate structures 220.

The method for forming the first gate structures 220 may include forming first dummy gate structures across the first fins 211 and the second fins 212 on the semiconductor substrate 200; forming the first interlayer dielectric layer to cover the semiconductor substrate 200, portions of the top and sidewall surfaces of the first fins 211, portions of the top and sidewall surfaces of the second fins 212, and portions of the sidewall surfaces of the first dummy gate structures; removing the first dummy gate structures to form gate openings in the first interlayer dielectric layer; and forming the first gate structure 220 in each of the gate openings.

In one embodiment, before forming the first interlayer dielectric layer, the first doped layer 231 may be formed in the first fins 211 at both sides of the first dummy gate structures, and the second doped layer 232 may be formed in the second fins 212 at both sides of the first dummy gate structures.

The first doped layer 231 and the second doped layer 232 may be formed by any appropriate process, such as an epitaxial process or an ion implantation process, etc. In one embodiment, the first doped layer 231 and the second doped layer 232 are formed by an epitaxial process.

The method for forming the first doped layer 231 may include forming first trenches in the first fins 211 at both sides of the first dummy gate structures; and forming the first doped layer 231 in the first trenches by the epitaxial process.

The method for forming the second doped layer 232 may include forming second trenches in the second fins 212 at both sides of the first dummy gate structures; and forming the second doped layer 232 in the second trenches.

In another embodiment, the first doped layer 231 and the second doped layer 232 may be formed by an ion implantation process. The ion implantation process may be performed on the first fins 211 and the second fins 212 at both sides of the first dummy gate structures to form the first doped layer 231 and the second doped layer 232.

In one embodiment, a protective layer may be formed on the first doped layer 231 and the second doped layer 232. The protective layer may protect the first doped layer 231 and the second doped layer 232 during forming other different types of doped layers.

The protective layer may be made of a material different from the material of the dielectric layer 240. The protective layer may be made of silicon nitride, silicon oxynitride, silicon oxycarbide, silicon carbonitride, or silicon oxycarbonitride, etc.

In one embodiment, the protective layer is made of silicon nitride; and the dielectric layer 240 may be made of silicon oxide. The silicon nitride may have a desired etching selectivity with respect to silicon oxide. When the dielectric layer 240 is subsequently etched, silicon oxide may be removed while silicon nitride may be less etched. Accordingly, the first doped layer 231 and the second doped layer 232 may be well protected.

The first doped layer 231 and the second doped layer 232 may be doped with source/drain ions. When the conductivity type of the semiconductor device is N-type, the conductivity type of the source/drain ions may be N-type, such as phosphorus ions, etc. When the conductivity type of the semiconductor device is P-type, the conductivity type of the source/drain ions may be P-type, such as boron ions, etc.

After forming the first gate structures 220, the first doped layer 231 and the second doped layer 232, the second interlayer dielectric layer may be formed on the first interlayer dielectric layer and the first gate structures 220. The second interlayer dielectric layer may cover the surface of the isolation layer 201, the surfaces of the fins, the top surfaces of the first gate structures 220, the top and sidewall surfaces of the first doped layer 231 and the second doped layer 232.

In some embodiments, the first device region and the second device region may be used to form PMOS transistors or NMOS transistors.

In other embodiments, the base substrate may also include second gate structures, the second gate structures may be formed in the second region of the base substrate, and the first doped layers and the second doped layers may be respectively formed at two sides of the second gate structures.

Figure 5:
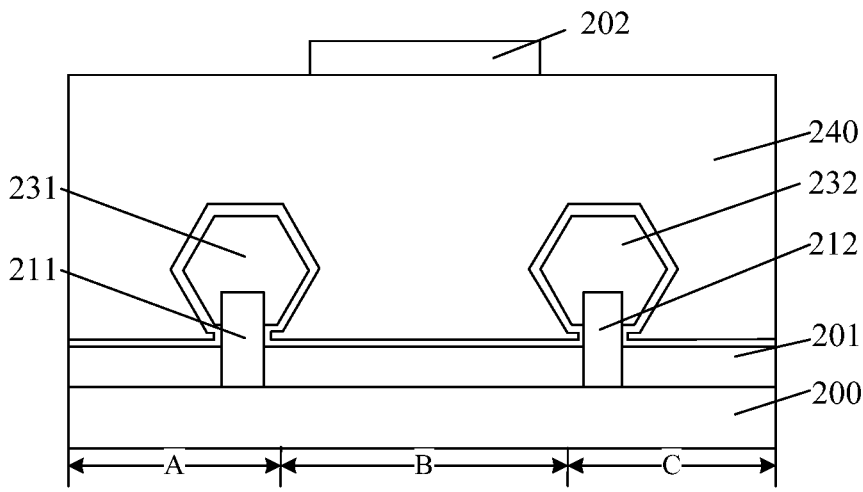

Returning to FIG. 13, after providing the base substrate having the certain structures, a first mask layer may be formed (S102). FIG. 5 illustrates a corresponding semiconductor structure.

As shown in FIG. 5, a first mask layer 202 may be formed on the dielectric layer 240 in the second region B. The first mask layer 202 and the subsequently formed second mask layer may determine the positions of subsequently formed first trenches, and the size of the first mask layer 202 may determine the size of a subsequently formed second trench.

The first mask layer 202 may be made of any appropriate material, such as silicon nitride, silicon carbonitride, silicon boronitride, silicon oxycarbonitride, or silicon oxynitride, etc.

The method for forming the first mask layer 202 may include forming an initial first mask layer (not shown) on the dielectric layer 240; forming a patterned layer (not shown) on the surface of the initial first mask layer to expose a portion of the surface of the initial first mask layer; and etching the initial first mask layer using the patterned layer as an etching mask to form the first mask layer 202 on the dielectric layer 240.

The width of the first mask layer 202 along a direction perpendicular to the extending (length) direction of the first fins 211 and parallel to the lateral direction of the base substrate may be in a range of approximately 20 nm to 40 nm. The size of the first mask layer 202 may determine the width of the subsequently formed second trench along the direction perpendicular to the length direction of the first fins 211 and parallel to the lateral direction of the base substrate.

Figure 6:
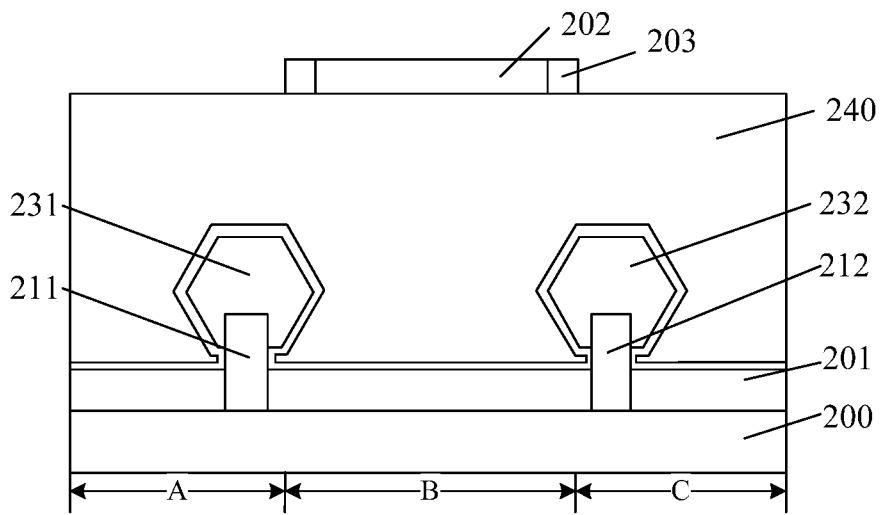

Returning to FIG. 13, after forming the first mask layer, a second mask layer may be formed (S103). FIG. 6 illustrates a corresponding semiconductor structure.

As shown in FIG. 6, a second mask layer 203 may be formed on the sidewall surfaces of the first mask layer 202, and on the surface of the dielectric layer 240 in the second region B. The second mask layer 203 may be used as a mask layer for subsequently forming the second trench.

The second mask layer 203 may be made of any appropriate material, such as silicon nitride, silicon carbonitride, silicon boronitride, silicon oxycarbonitride, or silicon oxynitride, etc.

The method for forming the second mask layer 203 may include forming a second mask material layer (not shown) on the dielectric layer 240 and the first mask layer 202; and etching back the second mask material layer until the top surface of the first mask layer 202 is exposed to form the second mask layer 203 on the sidewall surfaces of the first mask layer 202.

The width of the second mask layer 203 along the direction perpendicular to the extending direction of the first fins 211 and parallel to the lateral direction of the base substrate may be in a range of approximately 3 nm-15 nm.

The size of the second mask layer 203 may determine the distance between the subsequently formed second trench and the first trenches along the direction perpendicular to the length direction of the first fins 211 and parallel to the lateral direction of the base substrate.

The second mask layer 203 may be formed on the sidewall surfaces of both sides of the first mask layer 202, and the thicknesses of the portions of the second mask layer 203 on the sidewall surfaces of the first mask layer 202 may be substantially the same. Correspondingly, the subsequently formed second trench may have same distances from two adjacent first trenches.

Figure 7:
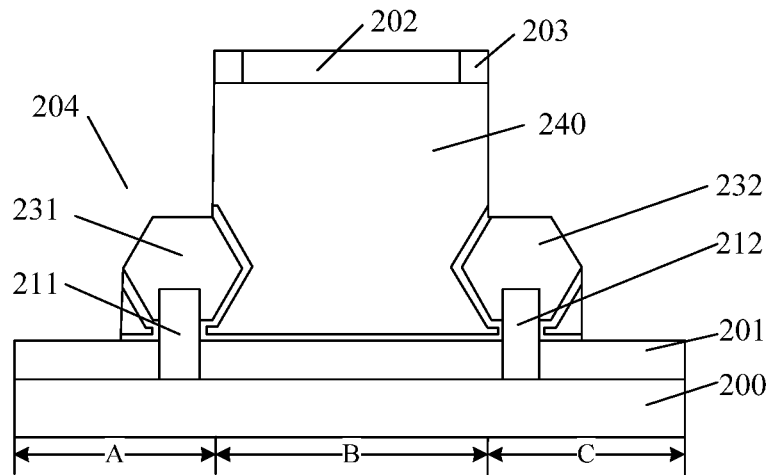
Figure 8:
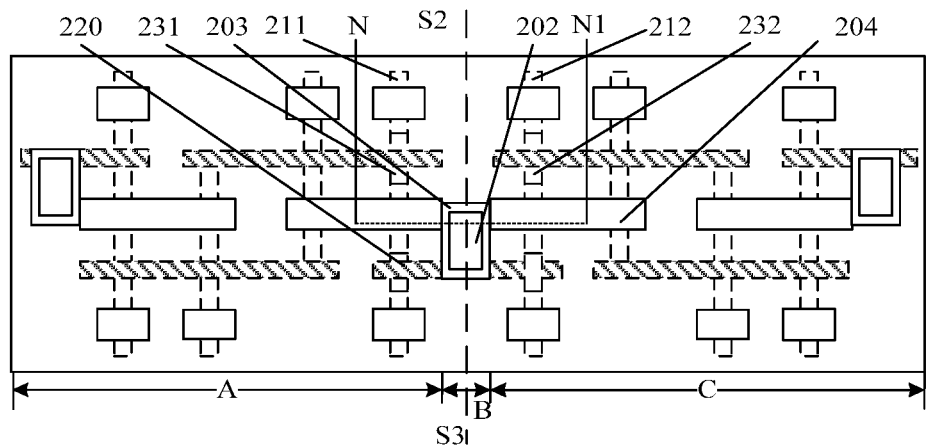

Returning to FIG. 13, after forming the second mask layer, first trenches may be formed (S104). FIGS. 7-8 illustrate a corresponding semiconductor structure. FIG. 8 is based on FIG. 3, and FIG. 7 is an N-N1-sectional view of FIG. 8.

As shown in FIGS. 7-8, a first trench 204 may be formed in the first region A and the second C, respectively. In particular, a first trench 204 may be formed in the first region A and another first trench 204 may be formed in the second region B. The first trenches 204 may be formed by etching the dielectric layer 240 in the first region A and the third region C using the first mask layer 202 and the second mask layer 203 as an etching mask.

The first trenches 204 may expose the first doped layer 231 and the second doped layer 232, respectively. In particular, the bottoms of the first trenches 204 may expose portions of the top and sidewall surfaces of the first doped layer 231 and the second doped layer 232 and a portion of the top surface of the isolation layer 201.

In one embodiment, a protective layer may be formed on the top surfaces the first doped layer 231 and the second doped layer 232. The process for forming the first trenches 204 may also include removing the portions of the protective layer on the surfaces of the first doped layer 231 and the second doped layer 232 exposed by the bottoms of the first trenches 204.

The first trenches 204 may provide spaces for subsequently forming first conductive structures. The dimensions of the first mask layer 202 and the second mask layer 203 may determine the distance between the first trenches 202 in the adjacent device regions.

Figure 9:
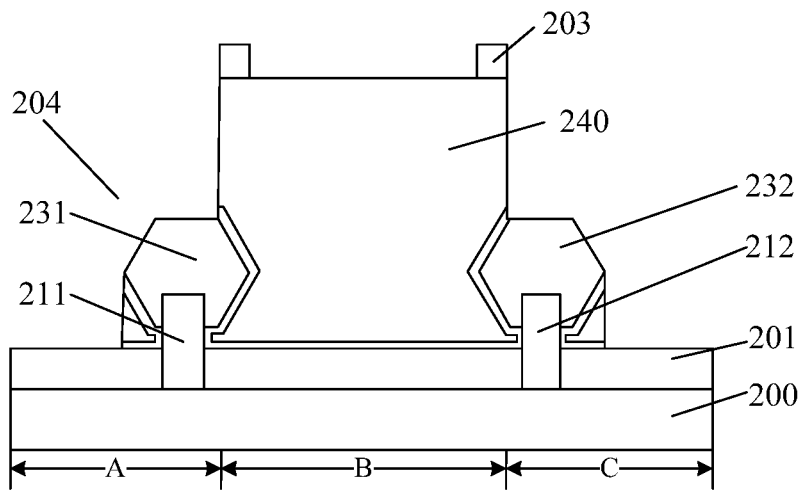

Returning to FIG. 13, after forming the first trenches, the first mask layer may be removed (S105). FIG. 9 illustrates a corresponding semiconductor structure.

As shown in FIG. 9, after forming the first trenches 204, the first mask layer 202 may be removed. The first mask layer 202 may be removed by any appropriate process, such as a dry etching process, etc.

After removing the first mask layer 202, the second mask layer 203 may be used as an etching mask for subsequently forming a second trench. The size between two portions the second mask layer 203 may determine the size of the subsequently formed second trench.

Figure 10:
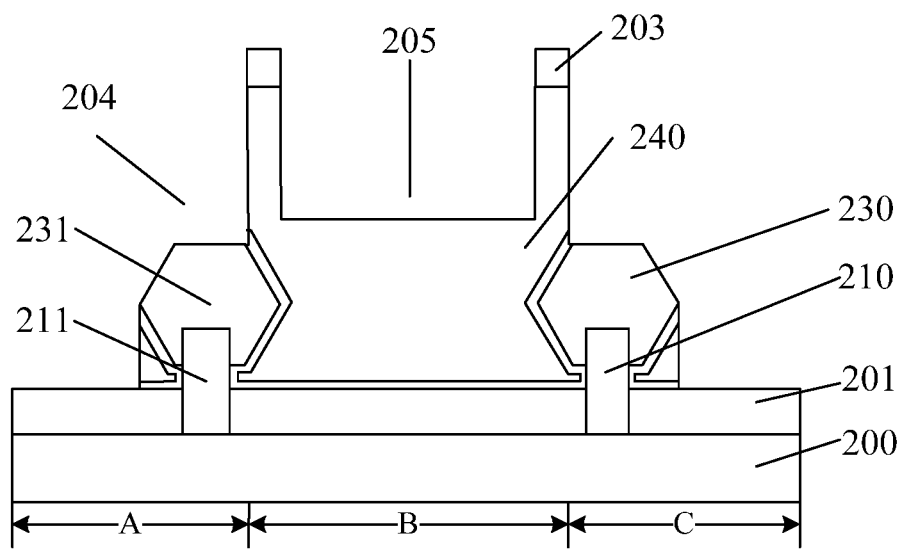

Returning to FIG. 13, after removing the first mask layer, a second trench may be formed (S106). FIG. 10 illustrates a corresponding semiconductor structure.

As shown in FIG. 10, after removing the first mask layer 202, the second region B of the dielectric layer 240 may be etched using the second mask layer 203 as an etch mask to form a second trench 205 in the second region B of the dielectric layer 240.

The dielectric layer 240 may include a first interlayer dielectric layer and a second interlayer dielectric layer. In particular, the second interlayer dielectric layer in the second region B may be etched by using the second mask layer 203 as a mask until the top surface of the first gate structure 220 is exposed to form the second trench 205 in the second region B of the dielectric layer 240.

In one embodiment, the second trench 205 may expose the top surface of one of the first gate structures 220 (referring to FIG. 8). The second trench 205 may provide a space for subsequently forming a second conductive structure.

The second mask layer 203 may determine the position and the shape of the second trench 205.

The size of the second mask layer 203 may determine the distances between the second trench 205 and the adjacent first trenches 204. The thicknesses of the portions of the second mask layer 203 on both sidewall surfaces of the first mask layer 202 may be substantially the same. Thus, the distances between the second trench 205 and the adjacent two first trenches 204 may be substantially equal. Accordingly, the thicknesses of the medium between the second trench 205 and the adjacent two first trenches 204 in the first region A and the third region C may be substantially the same. A first conductive structure may be subsequently formed in each of the first trenches 204, and a second conductive structure may be subsequently formed in the second trench 205. Thus, the thicknesses of the medium between the second conductive structure and the adjacent two first conductive structures in the first region A and the third region C may be substantially the same. Accordingly, the isolation effect between the first conductive structures and the second conductive structure may be as desired, and the performance of the semiconductor device may be improved.

In one embodiment, the second trench 205 may expose the top surface of the second gate structure.

In one embodiment, after forming the second trench 205, a first conductive structure may be formed in each of the first trench 204; and a second conductive structure may be formed in the second trench 205. The first conductive structures may be formed in the first region A and the third area C, respectively. The second conductive structure may be formed in the second region B.

The first conductive structure may be used to connect the first doped layer 231 or the second doped layer 232 with a subsequently formed first metal interconnect layer. The second conductive structure may be used to connect the first gate structure 220 with a subsequently formed first metal interconnect layer.

The method for forming the first conductive structure may include forming a first conductive material layer in the first trenches 204 and on the dielectric layer 240; and etching back the first conductive material layer until the surface of the dielectric layer 240 is exposed to the first conductive structure in each of the first trenches 204.

The method for forming the second conductive structure may include forming a second conductive material layer in the second trench 205 and on the dielectric layer 240; and etching back the second conductive material layer until the surface of the dielectric layer 240 is exposed to form the second conductive structure in the second trench 205.

In one embodiment, after forming the first conductive structure in the first trench 204, the second conductive structure may be formed in the second trench 205.

In some embodiments, the first conductive structure may be formed in the first trench 204 before removing the first mask layer 202.

In other embodiments, the first conductive structure may be formed in the first trench 204 after removing the first mask layer 202 and before forming the second trench 205.

The method for forming the second conductive structure may include forming a second conductive material layer in the second trench 205, on the first conductive structure and on the dielectric layer 240; and etching back the second conductive material layer until the surface of the dielectric layer 240 is exposed to form the second conductive structure in the second trench 205.

In one embodiment, after forming the second trench 205 and before forming the first conductive structures and the second conductive structure, the second mask layer 203 may be removed to expose the surface of the dielectric layer 240 at both sides of the second trench 205 in the first region A.

In another embodiment, after forming the first conductive structures and the second conductive structure, the second mask layer may be removed to expose the surface of the dielectric layer at both sides of the second conductive structure in the second region.

In one embodiment, the second conductive structure may be formed during the process for forming the first conductive structures. The second mask layer 203 may be removed during forming the first conductive structures and the second conductive structure.

In particular, returning to FIG. 13, after forming the second trench, an initial conductive material layer may be formed (S107). FIG. 11 illustrates a corresponding semiconductor structure.

As shown in FIG. 11, an initial conductive material layer 250 may be formed in the first trenches 204, in the second trench 205, and on the surface of the dielectric layer 240. In one embodiment, the initial conductive material layer 250 may cover the top and sidewall surfaces of the second mask layer 203.

The initial conductive material layer 250 may be made of any appropriate material, such as a metal material including tungsten, cobalt, titanium, or nickel, etc. In one embodiment, the initial conductive material layer 250 is made of tungsten.

The process for forming the initial conductive material layer 250 may be a deposition process, such as a chemical vapor deposition (CVD) process, a physical vapor deposition (PVD) process, or an atomic layer deposition (ALD) process, etc.

Before forming the initial conductive material layer 250, a metal layer (not shown) may be formed on the top surfaces and the sidewall surfaces of the first doped layer 231 and the second doped layer 232 and the top surfaces of the first gate structures 220 exposed at the bottoms of the first trenches 204 and the second trench 205. The metal layer may also be formed on the dielectric layer 240.

The metal layer may be made of any appropriate material, such as Ti, Co, or Ni, etc. Various processes may be used to form the metal layer, such as a deposition process including a sputtering process, etc.

After forming the metal layer, the first doped layer 231, the second doped layer 232, the metal layer and the gate layer may be annealed; and a metal silicide layer (not shown) may be formed on the surfaces of the first doped layer 231 and the surface of the second doped layer 232 exposed by the first trenches 204. In particular, during the annealing process, atoms of the metal layer may be diffused into the first doped layer 231 and the second doped layer 232 and the gate layer to react with the materials of the first doped layer 231 and the second doped layer 232 and the gate layer to form the metal silicide layer.

In one embodiment, because the surface materials of the first doped layer 231 and the second doped layer 232 may be doped with the source/drain ions, the metal silicide layer may also be doped with the source/drain ions. Thus, the resistance of the metal silicide layer may be reduced.

In one embodiment, a barrier layer (not shown) may also be formed on the surface of the metal layer before the annealing treatment. The barrier layer may be made of titanium nitride, or tantalum nitride. etc. The barrier layer may be formed by a deposition process, such as a sputtering process, etc. When the barrier layer is formed prior to the annealing process, the barrier layer may be able to protect the metal layer from being oxidized by the annealing process during the annealing process.

In another embodiment, the barrier layer may be formed after the annealing process. In some embodiments, no barrier layer may be formed.

Returning to FIG. 13, after forming the initial conductive material layer, first conductive structures and a second conductive structure may be formed (S108). FIG. 12 illustrates a corresponding semiconductor structure.

As shown in FIG. 12, after forming the initial conductive material layer 250, a first conductive structure 260 may be formed in each of the first trenches 204; and a second conductive structure 270 may be formed in the second trench 205. The first conductive structures 260 and the second conductive structure 270 may be formed by planarizing the initial conductive material layer 250 until the surface of the dielectric layer 240 is exposed.

The first conductive structures 260 may extend along a direction consistent with the extending (length) direction of the first gate structures 220. Further, the first conductive structures 260 may cover portions of the top and sidewall surfaces of the first doped layer 231 and the second doped layer 232.

The second conductive structure 270 may extend along a direction perpendicular to the extending (length) direction of the first gate structures 220 and parallel to the lateral direction the semiconductor substrate 200. Further, the second conductive structure 270 may cover portions of the top surfaces of the first gate structures 220; and may be electrically connected to one of the first gate structures 220.

The distance between the second conductive structure 270 and the first conductive structure 260 in the first region A and the distance between the second conductive structure 270 and the first conductive structure 260 in the third region C may be substantially equal. Thus, the isolation between the first conductive structures 260 and the second conductive structure 270 may be improved; and the performance of the semiconductor device may be enhanced.

The present disclosure also provides a semiconductor device. FIG. 12 illustrates a corresponding semiconductor structure.

As shown in FIG. 12, the semiconductor device may include a semiconductor substrate 200 having a first region A, a second region B and a third region C, a first fin 211 formed on the first region A of the semiconductor substrate 200, and a second fin 212 formed on the third region C of the semiconductor substrate 200. The semiconductor device may also include an isolation layer 201 formed on the semiconductor substrate 200 and covering portions of the sidewall surfaces of the first fin 211 and the second fin 212, a first doped layer 231 formed on the first fin 211, and a second doped layer 232 formed on the second fin 212. Further, the semiconductor device may include a dielectric layer 240 formed on the insolation layer 201 and covering the sidewall surfaces of the first doped layer 231 and the second doped layer 232. Further, the semiconductor device may include a first conductive structure 260 formed in the dielectric layer 240 in the first region A and on the isolation layer 201, a first conductive structure 260 formed in the dielectric layer 240 in the third region C and on the isolation layer 201, and a second conductive structure 270 formed in the dielectric layer 240 in the second region B. The distance between the second conductive structure 270 and the first conductive structure 260 in the first region A and the distance between the second conductive structure 270 and the first conductive structure 260 in the third region C may be substantially equal. The detailed structures and intermediate structures are described above with respect to the fabrication processes.

In the disclosed method for forming a semiconductor device, a first mask layer and a second mask layer may be used as an etching mask to etch the dielectric layer to form first trenches. The first mask layer and the second mask may together determine the positions of the first trenches. Further, the second mask layer may be used as an etching mask layer to etch the dielectric layer in the second region to form a second trench in the second region. The second mask layer may determine the position of the second trench, and the thickness of the second mask layer may determine the distance between the first trenches and the second trench. Because the second mask layer may formed on the sidewall surfaces of the first mask layer, the distance between the second trench and the first trench in the first region may be equal to the distance between the second trench and the first trench in the third region. Accordingly, the thickness of the dielectric layer between the second trench and the first trench in the first region may be equal to the thickness of the dielectric layer between the second trench and the first trench in the third region. A first conductive structure may be subsequently formed each of the first trenches, and a second conductive structure may be subsequently formed in the second trench. Thus, the thickness of the dielectric layer between the second conductive structure and the first conductive structure in the first region may be equal to the thickness of the dielectric layer between the second conductive structure and the first conductive structure in the third region. Accordingly, the isolation effect between the first conductive structures and the second conductive structure may be as desired; and the performance of the semiconductor device may be enhanced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor device, comprising:

providing a base substrate having a first region, a second region, a third region and a plurality of fins, wherein the second region is between the first region and the third region and the second region is adjacent to the first region and the third region;

forming a first doped layer in a fin of the plurality of fins of the first region of the base substrate;

forming a second doped layer in another fin the plurality of fins adjacent to the first doped layer in the third region of the base substrate;

forming a dielectric layer on the base substrate and covering the first doped layer and the second doped layer;

forming a first mask layer on the dielectric layer in the second region;

forming a second mask layer on sidewall surfaces of the first mask layer and on the dielectric layer in the second region;

etching the dielectric layer in the first region and the third region using the first mask layer and the second mask layer as an etching mask to form first trenches in the first and third regions, respectively exposing the first doped layer in the first region and the second doped layer in the third region;

removing the first mask layer; and etching the dielectric layer in the second region using the second mask layer as an etching mask to form a second trench in the dielectric layer in the second region.

2. The method according to claim 1, wherein:

the second mask layer is made of one of silicon nitride, silicon carbonitride, silicon boronitride, silicon oxycarbonitride, and silicon oxynitride.

3. The method according to claim 1, wherein:

a width of the second mask layer along a direction perpendicular to a length direction of the fins and parallel to a lateral direction of the base substrate is in a range of approximately 3 nm-15 nm.

4. The method according to claim 1, wherein forming the second mask layer comprises:

forming a second mask material layer on the dielectric layer and the first mask layer; and etching back the second mask material layer until a top surface of the first mask layer is exposed to form the second mask layer on the sidewall surfaces of the first mask layer.

5. The method according to claim 1, wherein:

the second mask layer is made of one of silicon nitride, silicon carbonitride, silicon boronitride, silicon oxycarbonitride, and silicon oxynitride.

6. The method according to claim 1, wherein forming the first mask layer comprises:

forming an initial first mask layer on the dielectric layer;

forming a patterned layer exposing a portion of the initial first mask layer on the initial first mask layer; and etching the initial first mask layer using the patterned layer as an etching mask to form the first mask layer on the dielectric layer.

7. The method according to claim 1, wherein:

a width of the first mask layer along a direction perpendicular to a length direction of the fins and parallel to a lateral direction of the base substrate is in a range of approximately 20 nm-40 nm.

8. The method according to claim 1, further comprising:

forming a first conductive structure in each of the first trenches; and forming a second conductive structure in the second trench.

9. The method according to claim 8, wherein forming the first conductive structure comprises:
- forming a first conductive material layer in the first trench and on the dielectric layer; and
- etching back the first conductive material layer until a surface of the dielectric layer is exposed to form the first conductive structure in the first trench.

10. The method according to claim 8, wherein forming the second conductive structure comprises:
- forming a second conductive material layer in the second trench and on the dielectric layer; and
- etching back the second conductive material layer until a surface of the dielectric layer is exposed to form the second conductive structure in the second trench.

11. The method according to claim 8, wherein:
the second conductive structure is formed after forming the first conductive structure.

12. The method according to claim 11, wherein:
the first conductive structures are formed in the first trenches before removing the first mask layer,
wherein forming the second conductive structure comprises:
- forming a second conductive material layer in the second trench, on the first conductive structures and on the dielectric layer; and
- etching back the second conductive material layer until a surface of the dielectric layer and a top surface of the first conductive structure are exposed to form the second conductive structure in the second trench.

13. The method according to claim 8, wherein:
the second conductive structure is formed when forming the first conductive structures.

14. The method according to claim 13, wherein forming the first conductive structures and the second conductive structure comprises:
- forming an initial conductive material layer in the first trenches and the second trench and on the dielectric layer; and
- planarizing the initial conductive material layer until a surface of the dielectric layer is exposed to form the first conductive structures in the first trenches and the second conductive structure in the second trench.

15. The method according to claim 8, after forming the first conductive structures and the second conductive structure, further comprising:
- removing the second mask layer to expose a surface of the dielectric layer at both sides of the second conductive structure.

16. The method according to claim 8, after forming second trench and before forming the first conductive structures and the second conductive structure, further comprising:
- removing the second mask layer to expose a surface of the dielectric layer at both sides of the second conductive structure.

17. A semiconductor device, comprising:
- a base substrate having a first region, a second region, a third region and a plurality of fins;
- an isolation layer formed on the semiconductor substrate and covering portions of the sidewall surfaces of the fins;
- a first doped layer formed in a first fin of the plurality of fins on the first region of the base substrate;
- a second doped layer formed in a second fin of the plurality of fins on the third region of the base substrate;
- a dielectric layer formed on the insolation layer and covering sidewall surfaces of the first doped layer and the second doped layer;
- first conductive structures formed in the dielectric layer in the first region and the third region, respectively; and
- a second conductive structure formed in the dielectric layer in the second region,
- wherein a distance between the second conductive structure and the first conductive structure in the first region and a distance between the second conductive structure and the first conductive structure in the third region are substantially equal.

18. The semiconductor device according to claim 17, wherein: the base substrate further comprises a first device region and a second device region adjacent to the first device region; the first device region and the second device region are axisymmetric along a central axis of the second region; the first region is within the first device region; the third region is within the second device region.

19. The semiconductor device according to claim 17, further comprising:
- first gate structures formed in the first region, the second region and the third region of the base substrate;
- wherein:
- the first gate structures are across the first fin and the second fin and cover portions of top and sidewall surfaces of the first fin and the second fin;
- the first doped layer is formed in the first fin at both sides of the first gate structure;
- the second doped layer is formed in the second fin at both sides of the first gate structure; and
- the second conductive structure is electrically connected to one of the first gate structures.

20. The semiconductor device according to claim 17, further comprising: a second gate structure formed in the second region of the base substrate, wherein: the first doped layer and the second doped layer are formed at both sides of the second gate structure; and the second conductive structure is electrically connected to the second gate structure.

* * * * *